US008982654B2

United States Patent
Dong et al.

(10) Patent No.: US 8,982,654 B2
(45) Date of Patent: Mar. 17, 2015

(54) DRAM SUB-ARRAY LEVEL REFRESH

(71) Applicant: QUALCOMM Incorporated, San Diego, CA (US)

(72) Inventors: Xiangyu Dong, San Diego, CA (US); Jungwon Suh, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/088,098

(22) Filed: Nov. 22, 2013

(65) Prior Publication Data

US 2015/0009769 A1 Jan. 8, 2015

Related U.S. Application Data

(60) Provisional application No. 61/843,110, filed on Jul. 5, 2013.

(51) Int. Cl.
*G11C 11/406* (2006.01)

(52) U.S. Cl.
CPC ........ *G11C 11/40618* (2013.01); *G11C 11/406* (2013.01)
USPC ............................. 365/222; 365/149; 365/194

(58) Field of Classification Search
CPC .......................... G11C 11/40618; G11C 11/406
USPC ................ 365/222, 149, 189.04, 194, 230.06
See application file for complete search history.

(56) References Cited

U.S. PATENT DOCUMENTS

| 4,344,157 | A | * | 8/1982 | White et al. | 365/222 |
|---|---|---|---|---|---|
| 5,307,320 | A | | 4/1994 | Farrer et al. | |
| 5,313,428 | A | * | 5/1994 | Inoue | 365/222 |
| 5,511,033 | A | * | 4/1996 | Jung | 365/222 |
| 5,818,777 | A | * | 10/1998 | Seyyedy | 365/222 |
| 6,560,155 | B1 | * | 5/2003 | Hush | 365/222 |
| 6,563,757 | B2 | | 5/2003 | Agata | |
| 6,697,909 | B1 | | 2/2004 | Wang et al. | |
| 6,721,224 | B2 | * | 4/2004 | Eaton et al. | 365/222 |
| 7,088,632 | B2 | | 8/2006 | Pelley | |
| 7,313,047 | B2 | | 12/2007 | Kim | |
| 7,471,586 | B2 | * | 12/2008 | Koshikawa | 365/222 |

* cited by examiner

*Primary Examiner* — Tan T. Nguyen
(74) *Attorney, Agent, or Firm* — Seyfarth Shaw LLP

(57) ABSTRACT

A memory controller coupled to a memory chip having a number of sub-arrays of memory cells is configured to determine a configuration of the memory chip. The memory controller is configured to read the sub-array configuration of the memory chip and to detect sub-array level conflicts between external commands and refresh operations. The memory controller keeps one or more non-conflicting pages open during the refresh operations.

20 Claims, 6 Drawing Sheets

DRAM SUB-ARRAY LEVEL REFRESH

CROSS REFERENCE TO RELATED APPLICATION

The present application claims the benefit of U.S. Provisional Patent Application No. 61/843,110, filed on Jul. 5, 2013, and titled "DRAM Sub-Array Level Refresh," the disclosure of which is expressly incorporated by reference herein in its entirety.

TECHNICAL FIELD

The present disclosure generally relates to memory refresh techniques. More specifically, the present disclosure relates to memory architectures and methods to refresh dynamic random access memory (DRAM) arrays.

BACKGROUND

The development of dynamic random access memory (DRAM) arrays with higher density and smaller feature sizes has increased the rate of DRAM refresh operations to compensate for a larger number of leaking memory cells. The higher DRAM refresh rate can impact system performance. For example, DRAM refresh operations can impede performance because all open pages of a memory bank are generally closed before a bank may be refreshed. Moreover, DRAM bank access is generally not allowed during a refresh operation, thus further impeding system performance.

SUMMARY

Aspects of the present disclosure include a method of refreshing a dynamic random access memory (DRAM). The method includes opening a page of the DRAM at a first row of a first DRAM bank of the DRAM. The first row of the first DRAM bank is in a first sub-array of the first DRAM bank. The method also includes refreshing a second row of the first DRAM bank before closing the first row of the DRAM bank. The second row of the first DRAM bank is in a second sub-array of the first DRAM bank.

Another aspect of the present disclosure includes a dynamic random access memory (DRAM) system. The DRAM system includes a memory chip having a number of sub-arrays of memory cells. Each sub-array has an allocated sense amplifier. The memory chip also has a mode register configured to store a sub-array configuration of the memory chip, a global row address latch, and a refresh counter. The memory chip also has a sub-array selector coupled to the global row address latch and the refresh counter. The memory chip also has a local row address latch coupled to the sub-array selector. The DRAM system also includes a memory controller coupled to the memory chip. The memory controller is configured to read the sub-array configuration of the memory chip, to detect a sub-array level conflict between an external command and a refresh operation, and to keep one or more non-conflicting pages open during the refresh operation.

A dynamic random access memory (DRAM) memory system according to another aspect of the present disclosure includes a memory chip having a number of sub-arrays of memory cells in which each sub-array includes an allocated sense amplifier. According to aspects of the present disclosure, the system includes means for storing a sub-array configuration of the memory chip, a global row address latch, a refresh counter, a sub-array selector coupled to the global row address latch and the refresh counter and a local row address latch coupled to the sub-array selector. The system also includes means for reading the sub-array configuration of the memory chip, means for detecting a sub-array level conflict between an external command and a refresh operation; and means for keeping one or more non-conflicting pages open during the refresh operation.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form to avoid obscuring such concepts. As described herein, the use of the term "and/or" is intended to represent an "inclusive OR", and the use of the term "or" is intended to represent an "exclusive OR".

Dynamic random access memory (DRAM) scaling continues to increase the total number of bits in each DRAM chip. This increased capacity directly impacts the specification of DRAM refresh operations, the process by which a bit cell's value is kept readable. The specification of DRAM refresh operations includes the interval at which refresh commands are sent to DRAM banks (tREFI), and the amount of time a refresh command occupies the DRAM interface (tRFC).

Unfortunately, DRAM scaling also increases the number of weak retention cells (e.g., cells that have a lower retention time). Such cells are subject to frequency refresh options to maintain the stored information. Performance and power consumption are significantly impacted by the increased refresh cycles on a DRAM in a system on chip (SoC) or other like computer architecture. Potential DRAM chip yield loss from the increased number of weak retention cells results without the increased refresh cycles.

According to aspects of the present disclosure the detrimental effects of increased dynamic random access memory (DRAM) refresh rates may be mitigated by refreshing sub-arrays in a DRAM bank while other sub-arrays in the memory bank are allowed to remain open and while access to the other sub-arrays is allowed.

Figure 1:
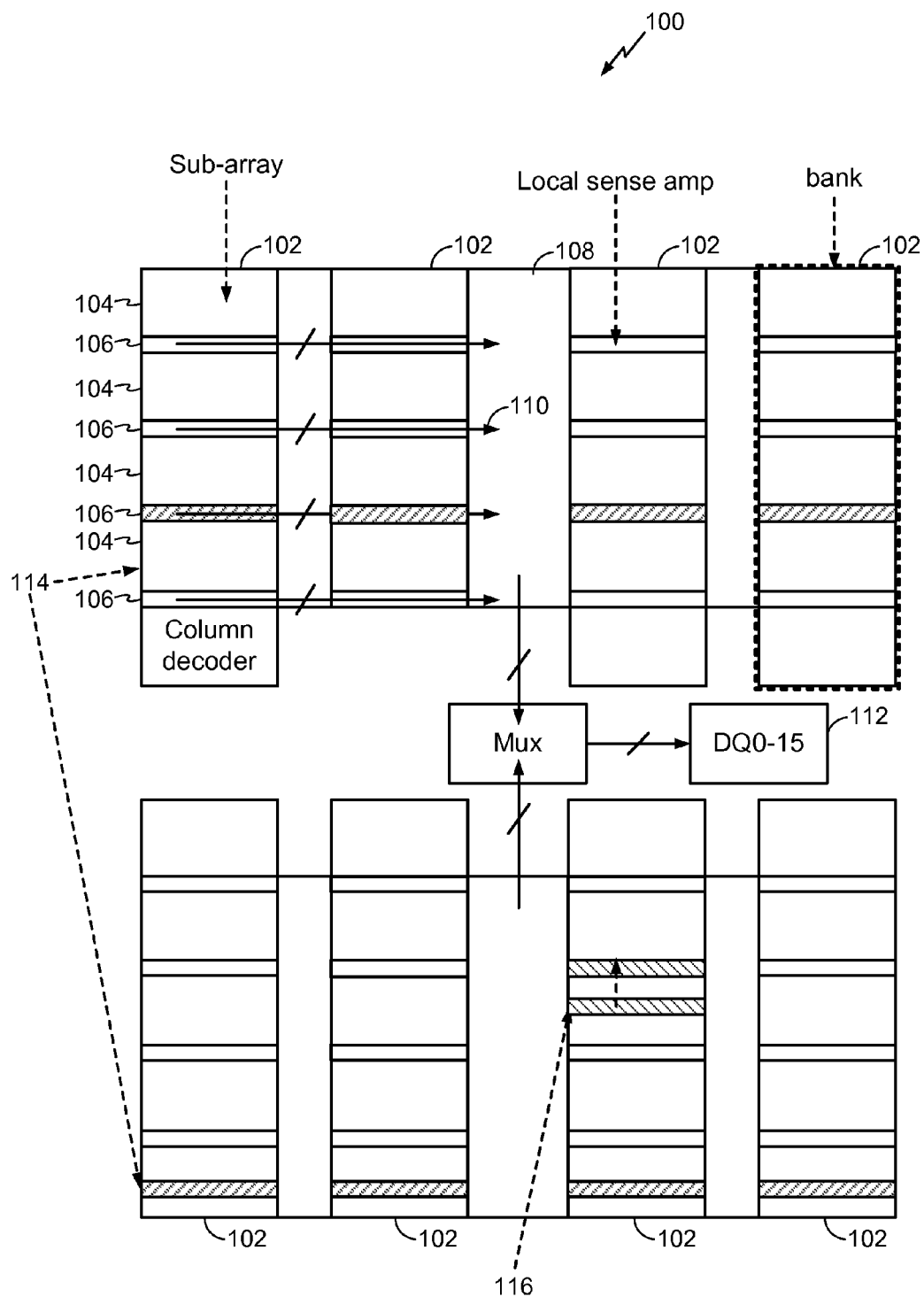
FIG. 1 is a diagram of a conventional DRAM array architecture.

FIG. 1 illustrates a DRAM 100 including eight DRAM banks 102. Each of the DRAM banks 102 includes four DRAM sub-arrays 104. Although FIG. 1 illustrates each bank 102 including four sub-arrays 104, it should be understood that implementations of the present disclosure may generally include 32, 64 or some other number of sub-arrays 104 in each DRAM bank 102. Local sense amplifiers 106 are coupled to the sub-arrays 104. The size of each of the local sense amplifiers 106 corresponds to the size of a DRAM page. For example, in current implementations, the page size can be up to about 4 kilobytes. Although FIG. 1 illustrates a simplified case where only 1 row is refreshed in each refresh cycle, it should be understood that more than one row may be refreshed for each refresh cycle. For example, a DRAM bank may have 32 k rows, but the refresh cycle may be implemented as an 8 k cycle. In this case, 4 rows per bank are refreshed during a refresh cycle (tRFC). These 4 rows are usually distributed into 4 sub-arrays. Thus, for a DRAM bank having 32 sub-arrays in total, while 4 of the sub-arrays are performing refresh operations, the remaining 28 sub-arrays are free for normal operations.

The local sense amplifiers 106 are coupled to a global input/output (I/O) sense amplifier through a narrower I/O sense amplifier bus 110. In one example, an I/O sense amplifier bus 110 may be 128 bits wide, however it should be understood that the I/O sense amplifier bus 110 may be implemented with different bus widths. In the illustrated example, a DRAM output bus 112 can be 16 bits wide for a pre-fetch operation with 8 data words for each memory access (i.e., 8n pre-fetch operation). It should be understood that the DRAM output bus 112 may also be implemented with different bus widths.

Conventionally, to refresh a bank in a DRAM array, the entire bank is first closed and no access is allowed to the bank during the refresh operation. However, according to aspects of the present disclosure, if a particular row (e.g., row 114, shown in FIG. 1) in each bank 102 is refreshed during an all-bank refresh operation, a bank 102 should not be closed unless the row being refreshed (e.g. row 114, shown in FIG. 1) is in the same sub-array as an open page. In FIG. 1, for example, the open page 116 is located in a sub-array of one bank 102. According to aspects of the present disclosure, because the open page 116 is not in the same sub-array as the row being refreshed (row 114), the page 116 can remain open during the refresh operation so that the entire bank 102 that includes the page 116 is not closed. On the other hand, according to aspects of the present disclosure, an entire bank is closed during a refresh operation only when a row being refreshed is in the sub-array of the bank including an open page.

Figure 2:
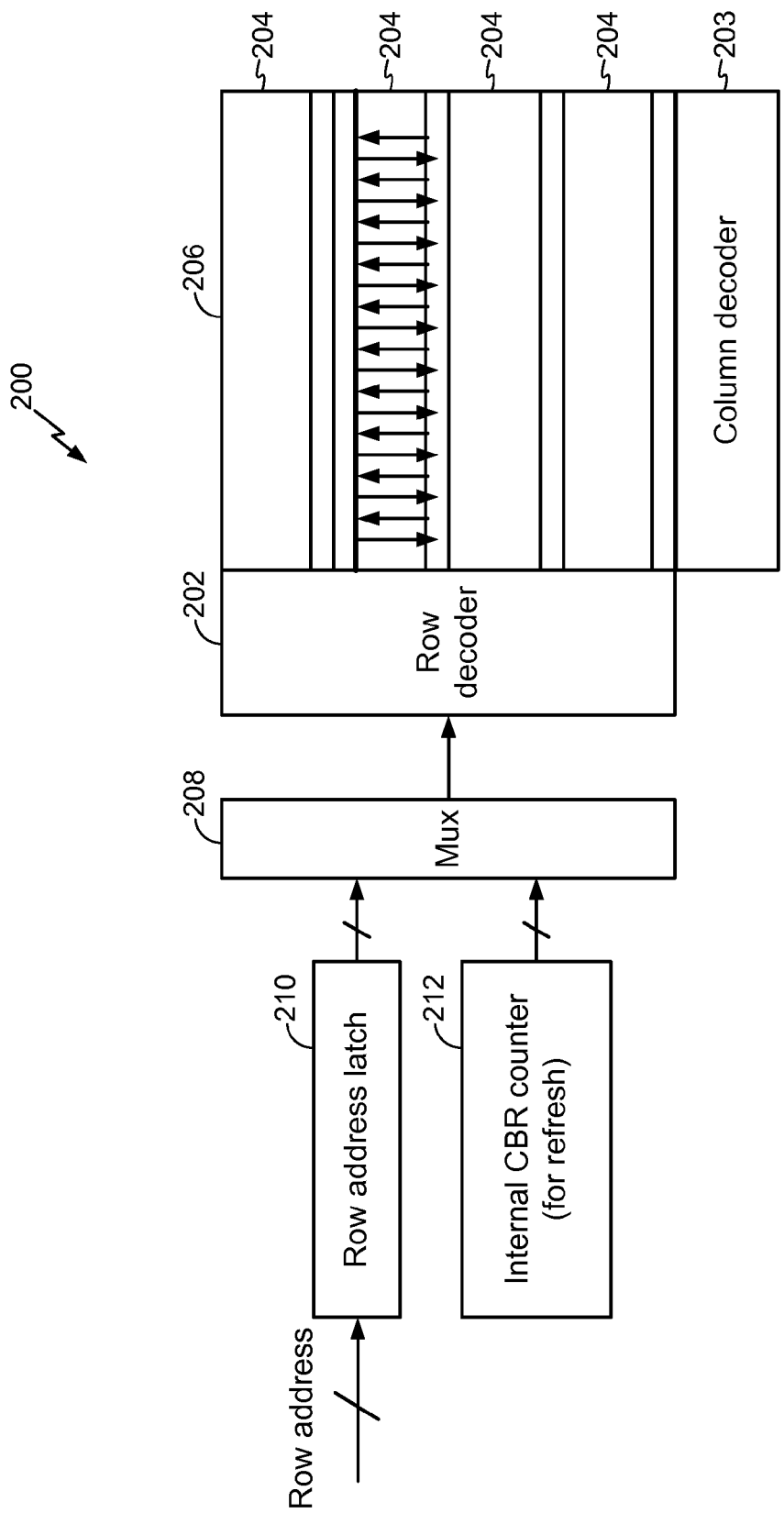
FIG. 2 is a diagram of a DRAM bank in a conventional DRAM array.

Referring to FIG. 2, a conventional DRAM architecture 200 includes a global row decoder 202 and a column decoder 203 coupled to each sub-array 204 in a DRAM bank 206. During normal memory access to the DRAM bank 206, when an activate command is received from a memory controller, a row address provided in the activate command is coupled by multiplexer circuitry 208 from a row address latch 210 to the global row decoder 202.

During a refresh operation, the multiplexer circuitry 208 couples a row address generated by a refresh counter 212 to the global row decoder 202. In this example, the refresh counter 212 is also called an internal column before row (CBR) counter. The refresh counter 212 tracks which row has been refreshed and which row should be refreshed in the next refresh cycle. In the conventional DRAM architecture 200, the refresh counter 212 generally starts at a random address.

The multiplexer circuitry 208 selects either the row address from the row address latch 210 during a normal memory access or the row address from the refresh counter 212 during a refresh operation. In the conventional DRAM architecture 200, only one wordline at a time is asserted by the global row decoder 202 based on the row address received from the multiplexer circuitry 208. This prevents other rows in the bank 206 from being accessed, even if a refresh is being performed in a different sub-array 204 within the bank 206.

Aspects of the present disclosure include a DRAM architecture that modifies the DRAM device and the memory controller. Changes to the DRAM device allow multiple word lines to be asserted at the same time.

Figure 3:
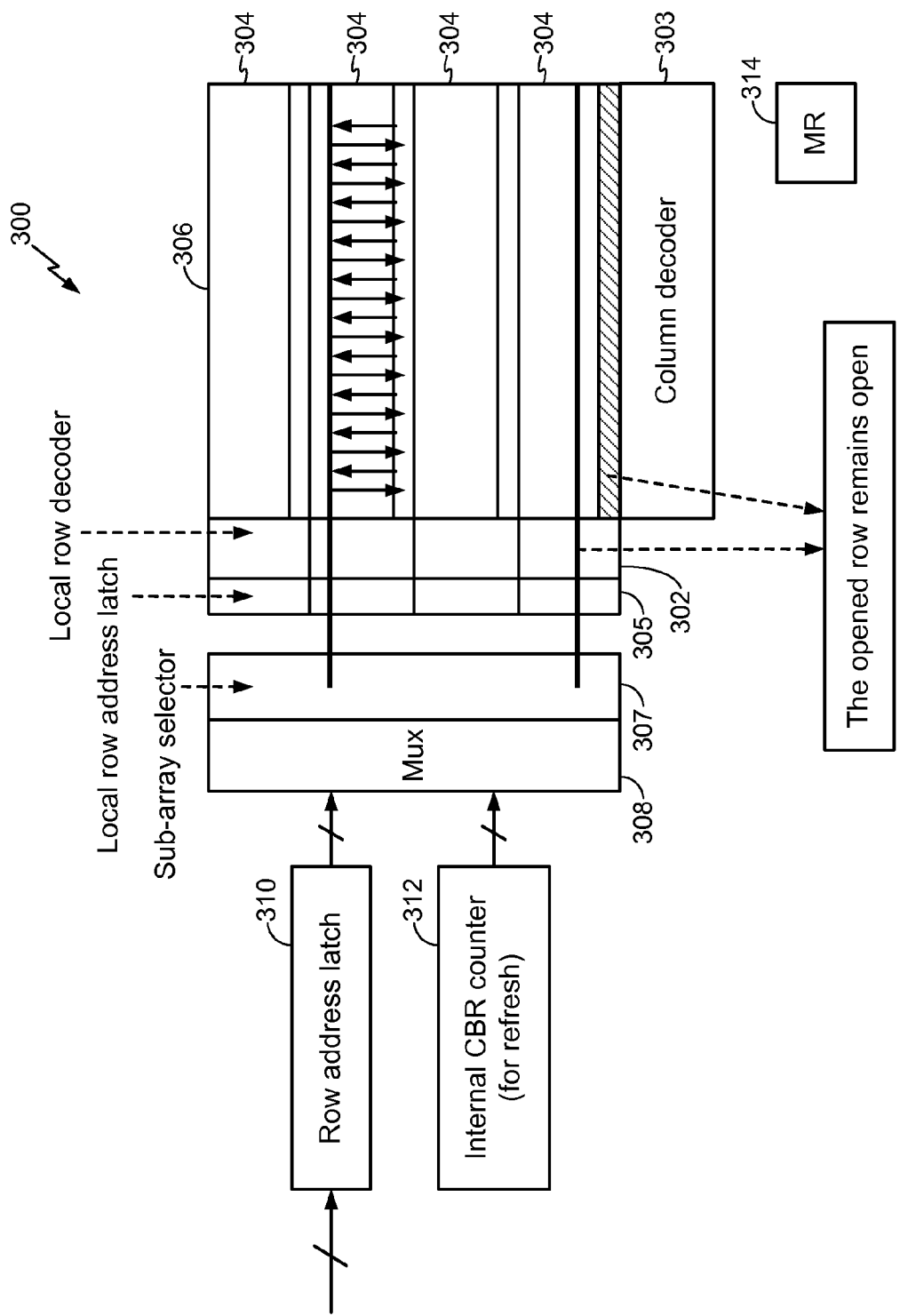
FIG. 3 is a diagram of a DRAM bank according to aspects of the present disclosure.

Referring to FIG. 3, a DRAM architecture 300 according to aspects of the present disclosure allows refresh operations on sub-arrays in a memory bank having open pages in other sub-arrays. The DRAM architecture 300 includes a local row decoder 302 and a column decoder 303 coupled to each sub-array 304 in a DRAM bank 306. A local row address latch 305 is coupled to the local row decoder 302. Multiplexer circuitry 308 coupled to a row address latch 310 and a refresh counter 312 couples row addresses to a sub-array selector 307.

According to aspects of the present disclosure, the conventional global row decoder is replaced by the sub-array selector 307 and local row decoder 302. This allows multiple (e.g., two) word lines to be fired at the same time to address rows in two separate sub-arrays. For example, one word line can be asserted based on a row address in a first one of the sub-arrays received from the row address latch 310 and, at the same time, another word line can be asserted based on a row address in a second one of the sub-arrays 304 received from the refresh counter 312.

According to aspects of the present disclosure, the refresh counter 312 may be started at 0 and is synchronized with an address controller. This synchronization enables the memory controller to know which row is being refreshed inside the DRAM device so that the memory controller can determine if the normal operation and refresh operation have a sub-array conflict. Synchronization may be implemented by initializing the refresh counter to zero at the power-up stage and adding a duplicate refresh counter at the memory controller side, which is also initialized to zero at power-up. Both counters will increment under the same condition. Although aspects of the present disclosure are described in which the refresh counter behavior is pre-defined, other aspects of the present disclosure include alternative implementations in which a memory controller is configured to explicitly provide an indication of which sub-array and which row in that sub-array may be refreshed in a next refresh cycle.

According to another aspect of the present disclosure, a mode register 314 is implemented to store and indicate to the memory controller the number of sub-arrays 304 in a DRAM bank 306. This allows the memory controller to determine the number of sub-arrays for each device, which may vary between memory devices provided by different vendors, for example.

Aspects of the present disclosure include a DRAM controller configured to allow access to sub-arrays in a DRAM bank while a row of another sub-array in the DRAM bank is refreshed. According to an aspect of the present disclosure, when the DRAM controller detects a conflict between an external command and an ongoing refresh operation, the DRAM controller may delay the external command. When the DRAM controller detects a conflict between a refresh operation and an ongoing external command, the DRAM controller may delay the refresh operation. According to aspects of the present disclosure, the DRAM controller may be incorporated on a chip with the DRAM or may be configured separately in circuitry that is coupled to the DRAM chip. A DRAM controller protocol engine is adapted to allow READ/WRITE/PRECHARGE commands during a refresh period (tRFC window) and to allow ACTIVATE commands during the tRFC window.

Figure 4A:
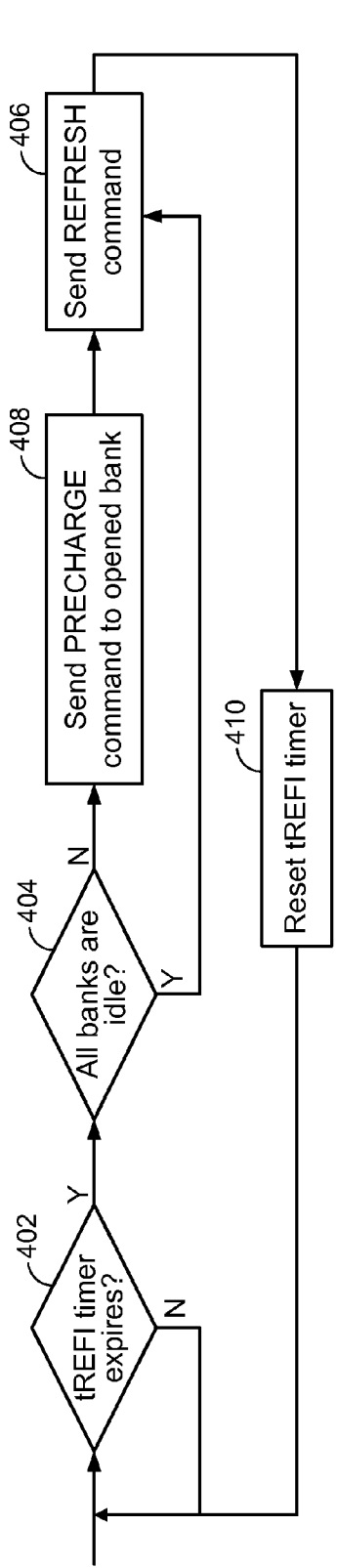
FIG. 4A is a functional block diagram illustrating functions of a conventional DRAM controller.

For comparison, conventional DRAM controller functionality is described with reference to FIG. 4A. At block 402, the DRAM controller determines whether a tREFI timer, which indicates a refresh period, has expired. When the tREFI timer has expired, at block 404, the DRAM controller determines whether all banks are idle. If all banks are idle, the DRAM controller sends a REFRESH command at block 406. If all banks are not idle, the DRAM controller sends a PRECHARGE command to open banks, at block 408, to close the opened banks, and then at block 406 sends the REFRESH command. After the REFRESH command is sent, the DRAM controller resets the tREFI timer at block 410.

Figure 4B:
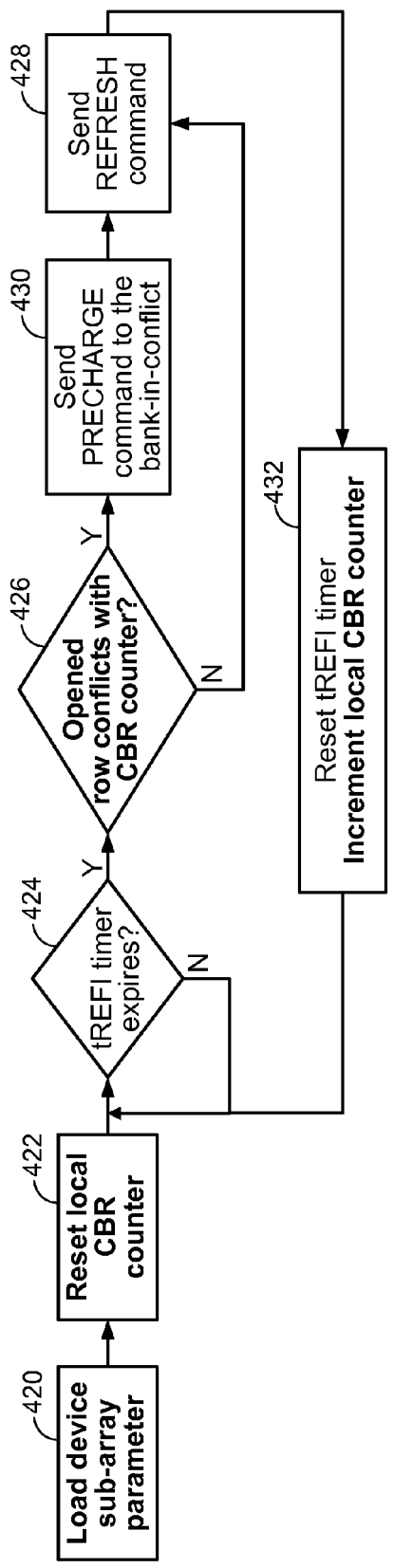
FIG. 4B is a functional block diagram illustrating functions of a DRAM controller according to aspects of the present disclosure.

The functionality of a DRAM controller according to aspects of the present disclosure is described with reference to FIG. 4B. At block 420, the DRAM controller loads device sub-array parameters. The device sub-array parameters may include information from the mode register 314 (FIG. 3), for example. At block 422, the DRAM controller resets a local refresh (CBR) counter. At block 424, the DRAM controller determines whether a tREFI timer, which indicates a refresh period, has expired. When the tREFI timer has expired, at block 426, the DRAM controller determines whether an open row conflicts with the local refresh counter. If no open row conflicts with the local refresh counter, i.e., no rows are open in the sub-array being refreshed, then in block 428, the DRAM controller sends a REFRESH command. If an open row conflicts with the local refresh counter, i.e., a row is open in the sub-array to be refreshed, then in block 430, the DRAM controller sends a PRECHARGE command to the bank in conflict to close only the bank in which a row of the sub-array being refreshed had been open. Then in block 428, the DRAM controller sends a REFRESH command. After the REFRESH command is sent, the DRAM controller resets the tREFI timer at block 432.

According to aspects of the present disclosure, the DRAM controller only sends the pre-charge command to close a bank in the case of a sub-array conflict. After the refresh command, both the DRAM side counter and the memory controller CBR counter are incremented. This allows an open row in the memory device during the refresh, which improves performance compared to the conventional DRAM architecture in which all open rows are closed before refresh.

According to aspects of the present disclosure, because sub-array level parallelism is configured, if the normal access command and the refresh are not in the same sub-arrays, read, write and also the pre-charge command are allowed during the tRFC window. The activation command is also allowed during the tRFC window, with some reasonable current draw limitations, because both the activation command and the refresh command consume a large amount of current. In one configuration, a reasonable timing is imposed between these two operations, but it is possible that the activate command and the refresh command are both issued within the tRFC window.

Although aspects of the present disclosure are described with reference to an architecture and method for refreshing all banks in a memory device during a refresh operation, it should be understood that the various aspects of the present disclosure may also be implemented in DRAM devices that are configured to perform refresh operations on a per-bank basis, in which a bank address is used to identify which bank will be refreshed.

A dynamic random access memory (DRAM) system according to an aspect of the present disclosure includes a memory chip having a number of sub-arrays of memory cells in which each sub-array includes an allocated sense amplifier. According to aspects of the present disclosure, the system includes means for storing a sub-array configuration of the memory chip. The means for storing a sub-array configuration of the memory chip may be a storage location on the memory chip or coupled to the memory chip such as the mode register 314 shown in FIG. 3, for example. The system also includes means for reading the sub-array configuration of the memory chip, means for detecting a sub-array level conflict between an external command and a refresh operation; and means for keeping one or more non-conflicting pages open during the refresh operation. The means for reading the sub-array configuration of the memory chip, means for detecting a sub-array level conflict between an external command and a refresh operation; and means for keeping one or more non-conflicting pages open during the refresh operation may be a memory controller coupled to the memory chip or memory controller circuitry configured on the memory chip, for example.

In another configuration, the aforementioned means may be any module or any apparatus configured to perform the functions recited by the aforementioned means. Although specific means have been set forth, it will be appreciated by those skilled in the art that not all of the disclosed means are required to practice the disclosed configurations. Moreover, certain well known means have not been described, to maintain focus on the disclosure.

Figure 5:
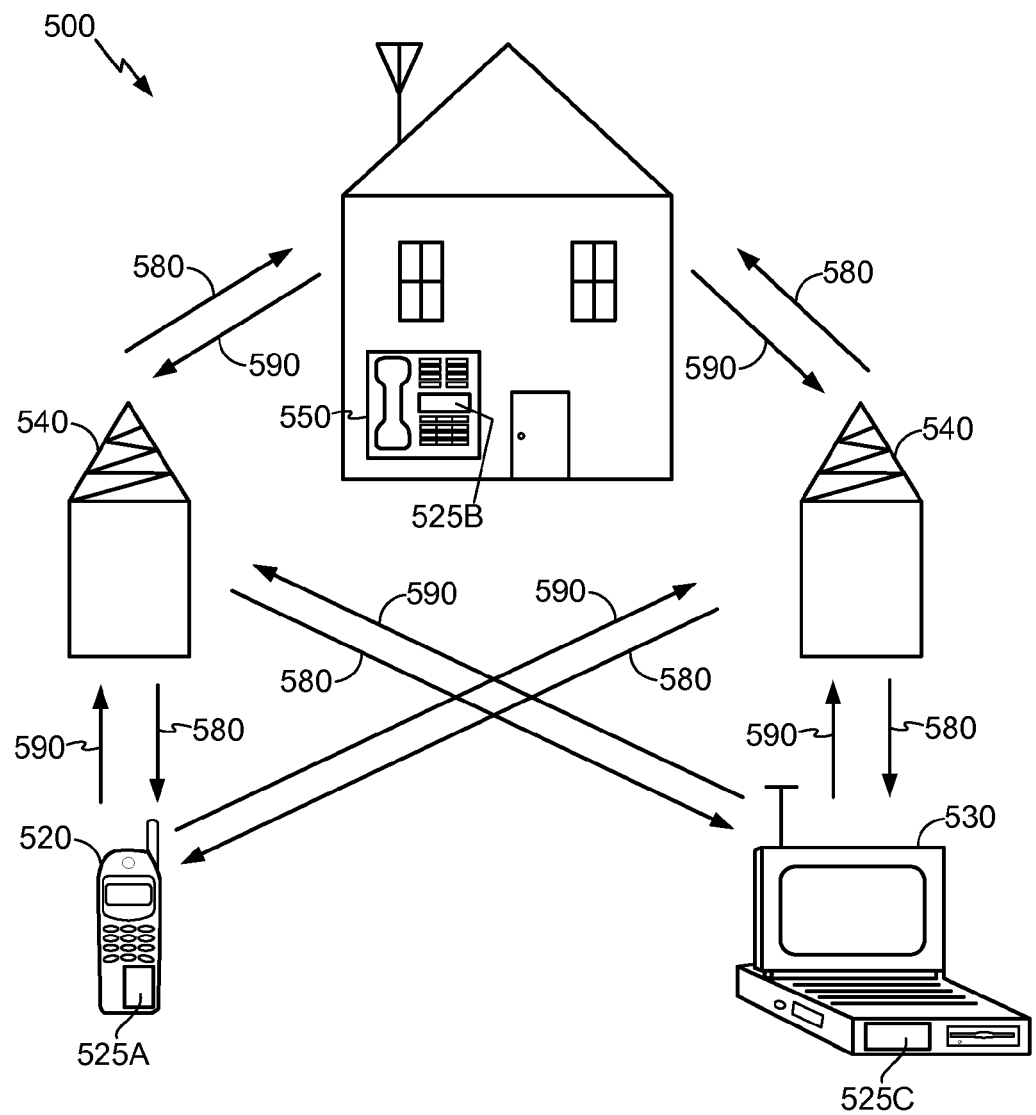
FIG. 5 is a block diagram showing an exemplary wireless communication system in which a configuration of the disclosure may be advantageously employed.

FIG. 5 is a block diagram showing an exemplary wireless communication system 500 in which an aspect of the disclosure may be advantageously employed. For purposes of illustration, FIG. 5 shows three remote units 520, 530, and 550 and two base stations 540. It will be recognized that wireless communication systems may have many more remote units and base stations. Remote units 520, 530, and 550 include IC devices 525A, 525C and 525B that include the disclosed memory cell array. It will be recognized that other devices may also include the disclosed memory cell arrays, such as the base stations, switching devices, and network equipment. FIG. 5 shows forward link signals 580 from the base station 540 to the remote units 520, 530, and 550 and reverse link signals 590 from the remote units 520, 530, and 550 to base stations 540.

In FIG. 5, remote unit 520 is shown as a mobile telephone, remote unit 530 is shown as a portable computer, and remote unit 550 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or other devices that store or retrieve data or computer instructions, or combinations thereof. Although FIG. 5 illustrates remote units according to the teachings of the disclosure, the disclosure is not limited to these exemplary illustrated units. Aspects of the disclosure may be suitably employed in many devices which include the disclosed memory cell arrays.

Figure 6:
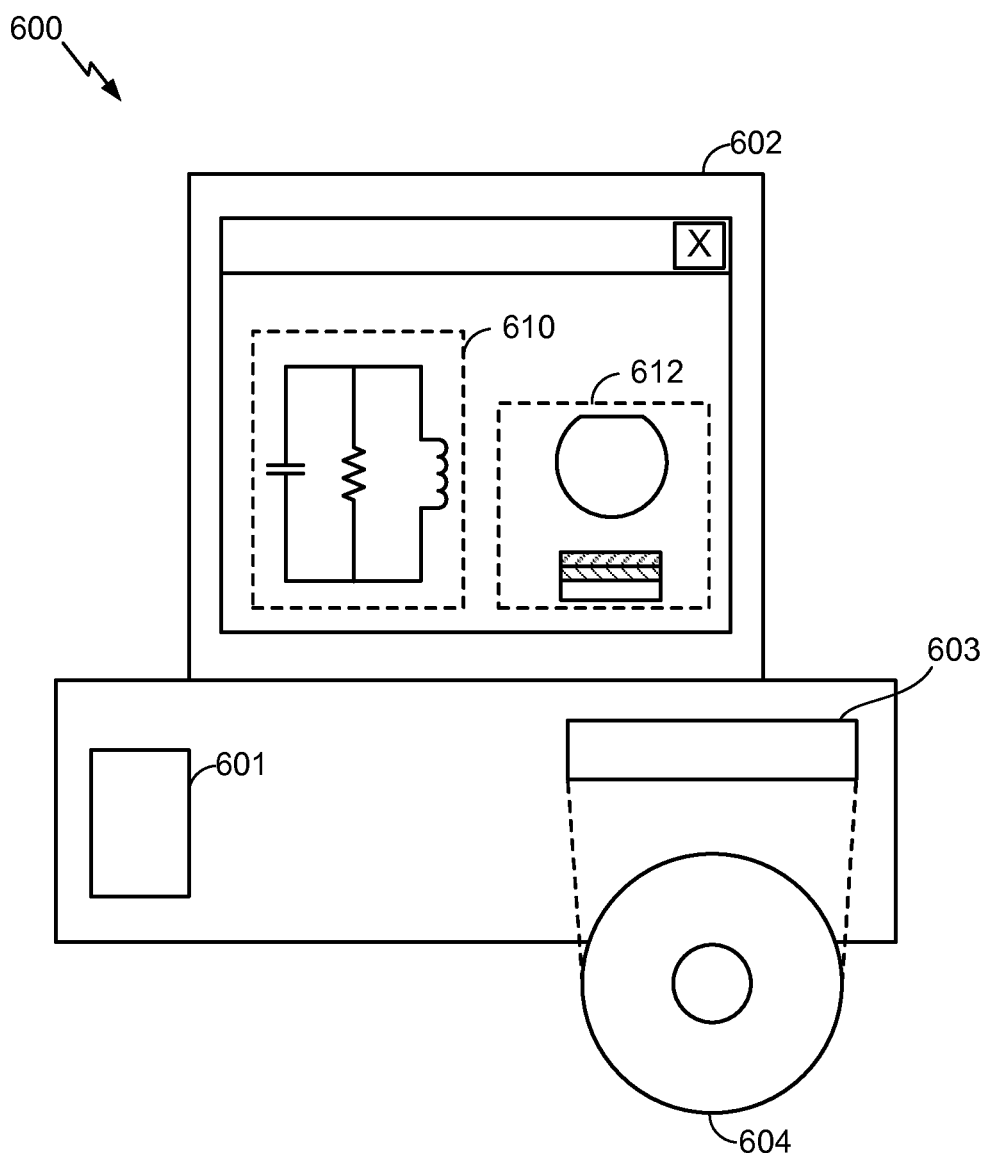
FIG. 6 is a block diagram illustrating a design workstation used for circuit, layout, and logic design of a semiconductor component according to one configuration.

FIG. 6 is a block diagram illustrating a design workstation used for circuit, layout, and logic design of a semiconductor component, such as the memory cell array disclosed above. A design workstation 600 includes a hard disk 601 containing operating system software, support files, and design software such as Cadence or OrCAD. The design workstation 600 also includes a display 602 to facilitate design of a circuit 610 or a semiconductor component 612 such as a memory cell array. A storage medium 604 is provided for tangibly storing the circuit design 610 or the semiconductor component 612. The circuit design 610 or the semiconductor component 612 may be stored on the storage medium 604 in a file format such as GDSII or GERBER. The storage medium 604 may be a CD-ROM, DVD, hard disk, flash memory, or other appropriate device. Furthermore, the design workstation 600 includes a drive apparatus 603 for accepting input from or writing output to the storage medium 604.

Data recorded on the storage medium 604 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 604 facilitates the design of the circuit design 610 or the semiconductor component 612 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Although specific circuitry has been set forth, it will be appreciated by those skilled in the art that not all of the disclosed circuitry is required to practice the disclosure. Moreover, certain well known circuits have not been described, to maintain focus on the disclosure. Similarly, although the description refers to logical "0" and logical "1" in certain locations, one skilled in the art appreciates that the logical values can be switched, with the remainder of the circuit adjusted accordingly, without affecting operation of the present disclosure.

Although the present disclosure and its advantages have been described in detail, it should be understood that various changes, substitutions and alterations can be made herein without departing from the spirit and scope of the disclosure as defined by the appended claims. For example, although the preceding description was with respect to asserting two word lines at the same time, more than two word lines could be asserted. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. A method of refreshing a dynamic random access memory (DRAM), comprising:
   opening a page of the DRAM at a first row of a first DRAM bank of the DRAM, in which the first row of the first DRAM bank is in a first sub-array of the first DRAM bank; and
   refreshing a second row of the first DRAM bank before closing the first row of the first DRAM bank, in which the second row of the first DRAM bank is in a second sub-array of the first DRAM bank.

2. The method of claim 1, further comprising closing all rows of the first DRAM bank before refreshing a third row of the first DRAM bank only when the third row of the first DRAM bank is in the first sub-array of the first DRAM bank.

3. The method of claim 2, further comprising refreshing the third row in a set of DRAM banks, the set of DRAM banks including the first DRAM bank.

4. The method of claim 1, further comprising:
   resetting a local refresh counter;
   determining whether a refresh period has expired based on the local refresh counter; and
   determining whether an opened row conflicts with the local refresh counter in response to determining that the refresh period has expired.

5. The method of claim 4, further comprising:
   sending a precharge command to a bank including an opened row in response to determining the opened row conflicts with the local refresh counter; and
   sending a refresh command after sending the precharge command.

6. The method of claim 5, further comprising sending a refresh command without sending the precharge command to the bank including the opened row in response to determining that no opened row conflicts with the local refresh counter.

7. The method of claim 1, further comprising integrating the DRAM into a mobile phone, a set top box, a music player, a video player, an entertainment unit, a navigation device, a computer, a hand-held personal communication systems (PCS) unit, a portable data unit, and/or a fixed location data unit.

8. A dynamic random access memory (DRAM) system, comprising:
   a memory chip comprising:
      a plurality of sub-arrays of memory cells, each of the sub-arrays having an allocated sense amplifier;
      a mode register configured to store a sub-array configuration of the memory chip;
      a global row address latch;
      a refresh counter;
      a sub-array selector coupled to the global row address latch and the refresh counter; and
      a local row address latch coupled to the sub-array selector; and
   a memory controller coupled to the memory chip, the memory controller configured to read the sub-array configuration of the memory chip, to detect a sub-array level conflict between an external command and a refresh operation, and to keep at least one non-conflicting page open during the refresh operation.

9. The system of claim 8, in which the memory controller includes a duplicate refresh counter configured to detect the sub-array level conflict.

10. The system of claim 8, in which the memory controller is configured to delay the external command when the external command conflicts with an ongoing refresh operation.

11. The system of claim 8 in which the memory controller is configured to delay the refresh command when the refresh command conflicts with an ongoing external command.

12. The system of claim 8, in which the global row address latch is configured to provide a first row address to the sub-array selector for accessing a first row of a DRAM bank and the refresh counter is configured to provide a second row address to the sub-array selector for refreshing a second row of the DRAM bank.

13. The system of claim 12, in which the sub-array selector is configured to turn on a first word line for accessing the first row of the DRAM bank based on the first row address and to turn on a second word line to refresh the second row of the DRAM bank based at least in part on the second row address.

14. The system of claim 13, further comprising multiplexer circuitry coupled to the sub-array selector, the multiplexer circuitry configured to allow the sub-array selector to turn on the first word line and the second word line at the same time only when the first word line and the second word line are in different sub-arrays of the DRAM bank.

15. The system of claim 8, integrated into a mobile phone, a set top box, a music player, a video player, an entertainment unit, a navigation device, a computer, a hand-held personal communication systems (PCS) unit, a portable data unit, and/or a fixed location data unit.

16. A method of refreshing a dynamic random access memory (DRAM), comprising steps for:
   opening a page of the DRAM at a first row of a first DRAM bank of the DRAM, in which the first row of the first DRAM bank is in a first sub-array of the first DRAM bank; and
   refreshing a second row of the first DRAM bank before closing the first row of the first DRAM bank, in which the second row of the first DRAM bank is in a second sub-array of the first DRAM bank.

17. The method of claim 16, further comprising steps for integrating the DRAM into a mobile phone, a set top box, a music player, a video player, an entertainment unit, a navigation device, a computer, a hand-held personal communication systems (PCS) unit, a portable data unit, and/or a fixed location data unit.

18. A dynamic random access memory (DRAM) memory system, comprising:
   a memory chip comprising:
      a plurality of sub-arrays of memory cells, each sub-array having an allocated sense amplifier;
      means for storing a sub-array configuration of the memory chip;
      a global row address latch;
      a refresh counter;
      a sub-array selector coupled to the global row address latch and the refresh counter; and a local row address latch coupled to the sub-array selector;

means for reading the sub-array configuration of the memory chip;

means for detecting a sub-array level conflict between an external command and a refresh operation; and means for keeping at least one non-conflicting page open during the refresh operation.

19. The system of claim 18, comprising:

means for delaying the external command when the external command conflicts with an ongoing refresh operation; and means for delaying a refresh command when the refresh command conflicts with an ongoing external command.

20. The system of claim 18, integrated into a mobile phone, a set top box, a music player, a video player, an entertainment unit, a navigation device, a computer, a hand-held personal communication systems (PCS) unit, a portable data unit, and/or a fixed location data unit.

\* \* \* \* \*